US011012181B2

(12) United States Patent
Motozuka et al.

(10) Patent No.: US 11,012,181 B2
(45) Date of Patent: May 18, 2021

(54) TRANSMISSION APPARATUS AND TRANSMISSION METHOD

(71) Applicant: Panasonic Intellectual Property Corporation of America, Torrance, CA (US)

(72) Inventors: Hiroyuki Motozuka, Kanagawa (JP); Takenori Sakamoto, Kanagawa (JP)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 0 days.

(21) Appl. No.: 16/623,791

(22) PCT Filed: Jul. 5, 2018

(86) PCT No.: PCT/JP2018/025428
§ 371 (c)(1),
(2) Date: Dec. 18, 2019

(87) PCT Pub. No.: WO2019/021776
PCT Pub. Date: Jan. 31, 2019

(65) Prior Publication Data
US 2020/0112388 A1 Apr. 9, 2020

Related U.S. Application Data

(60) Provisional application No. 62/537,843, filed on Jul. 27, 2017.

(30) Foreign Application Priority Data

May 10, 2018 (JP) .............................. JP2018-091373

(51) Int. Cl.
*H04B 7/00* (2006.01)
*H04L 1/00* (2006.01)

(52) U.S. Cl.
CPC ............ *H04L 1/0008* (2013.01); *H04L 1/003* (2013.01)

(58) Field of Classification Search
None
See application file for complete search history.

(56) References Cited

U.S. PATENT DOCUMENTS

2013/0097470 A1\* 4/2013 Hwang ............. H03M 13/6356
714/758
2016/0164709 A1\* 6/2016 Kim .................. H03M 13/6362
375/295
(Continued)

OTHER PUBLICATIONS

International Search Report of PCT application No. PCT/JP2018/025428 dated Sep. 18, 2018.
(Continued)

*Primary Examiner* — Phirin Sam
(74) *Attorney, Agent, or Firm* — Seed IP Law Group LLP

(57) ABSTRACT

A transmission apparatus determines the size of padding data by using the group size of each of a plurality of transmission streams calculated on the basis of a code rate and a modulation scheme that are set for each transmission stream and the number of groups calculated from the size of input transmission data and the group size of the each transmission stream, adds padding data having the determined size to the transmission data, distributes the transmission data and the padding data to generate the plurality of transmission streams, encodes and modulates each of the generated transmission streams with the code rate and the modulation scheme that are set for each transmission stream, converts the modulated transmission streams into radio signals, and transmits the radio signals from a plurality of transmitting antennas.

4 Claims, 10 Drawing Sheets

(56) References Cited

U.S. PATENT DOCUMENTS

| | | | | |
|---|---|---|---|---|
| 2017/0149526 A1* | 5/2017 | Yang | .................. | H04L 1/0057 |
| 2017/0353302 A1* | 12/2017 | Fernandez | .......... | G06F 21/6254 |
| 2018/0007561 A1* | 1/2018 | Adachi | ................ | H04W 72/12 |
| 2018/0278370 A1* | 9/2018 | Jeong | .................. | H03M 13/116 |
| 2019/0068324 A1* | 2/2019 | Taniguchi | ............. | H04L 1/0045 |
| 2020/0112469 A1* | 4/2020 | Sakamoto | ........... | H04L 27/2602 |

OTHER PUBLICATIONS

IEEE 802.11-17/0214r1, "29.5.7.27 Encoding", Feb. 13, 2017.
IEEE 802.11-17/0211r1, "MIMO Coding for SC PHY in 11ay", Feb. 13, 2017.
IEEE P802.11 Wireless LANs doc.:11-17-1424-00-00ay Optional MCS12 and 13 Draft Text, "Alternative MCS12 and MCS13 Text", Aug. 16, 2017.
IEEE P802.11 Wireless LANs doc.: IEEE 802.11-yy/xxxxr0, "Proposed Comment Resolution for CID 1, 2, 23, 525", Jul. 9, 2017.
IEEE 802.11-15/01358r9, "Specification Framework for TGay", Oct. 8, 2016.

\* cited by examiner

FIG. 6A

| L_CW(i_SS) | MODULATION SCHEME | N_BPSC(i_SS) | M(i_SS) | Ng(i_SS) (WHEN R = 13/16) |
|---|---|---|---|---|
| 624 | π/2 SHIFT BPSK | 1 | 1 | 13 |
| 624 | π/2 SHIFT QPSK | 2 | 2 | 26 |
| 624 | π/2 SHIFT 16QAM | 4 | 4 | 52 |
| 624 | π/2 SHIFT 64QAM | 6 | 2 | 78 |
| 672 | π/2 SHIFT BPSK | 1 | 1 | 13 |
| 672 | π/2 SHIFT QPSK | 2 | 1 | 26 |
| 672 | π/2 SHIFT 16QAM | 4 | 2 | 52 |
| 672 | π/2 SHIFT 64QAM | 6 | 1 | 78 |
| 1248 | π/2 SHIFT BPSK | 1 | 1 | 13 |
| 1248 | π/2 SHIFT QPSK | 2 | 1 | 26 |
| 1248 | π/2 SHIFT 16QAM | 4 | 2 | 52 |
| 1248 | π/2 SHIFT 64QAM | 6 | 1 | 78 |
| 1344 | π/2 SHIFT BPSK | 1 | 1 | 13 |
| 1344 | π/2 SHIFT QPSK | 2 | 1 | 26 |
| 1344 | π/2 SHIFT 16QAM | 4 | 1 | 52 |
| 1344 | π/2 SHIFT 64QAM | 6 | 1 | 78 |

FIG. 6B

| L_CW(i_SS) | MODULATION SCHEME | N_BPSC(i_SS) | M(i_SS) | Ng(i_SS) (WHEN R = 13/16) |
|---|---|---|---|---|
| 624 | π/2 SHIFT BPSK | 1 | 1 | 39 |
| 624 | π/2 SHIFT QPSK | 2 | 2 | 78 |
| 624 | π/2 SHIFT 16QAM | 4 | 4 | 156 |
| 624 | π/2 SHIFT 64QAM | 6 | 6 | 234 |
| 672 | π/2 SHIFT BPSK | 1 | 1 | 39 |
| 672 | π/2 SHIFT QPSK | 2 | 1 | 78 |
| 672 | π/2 SHIFT 16QAM | 4 | 2 | 156 |
| 672 | π/2 SHIFT 64QAM | 6 | 3 | 234 |
| 1248 | π/2 SHIFT BPSK | 1 | 1 | 39 |
| 1248 | π/2 SHIFT QPSK | 2 | 1 | 78 |
| 1248 | π/2 SHIFT 16QAM | 4 | 2 | 156 |
| 1248 | π/2 SHIFT 64QAM | 6 | 3 | 234 |
| 1344 | π/2 SHIFT BPSK | 1 | 1 | 39 |
| 1344 | π/2 SHIFT QPSK | 2 | 1 | 78 |
| 1344 | π/2 SHIFT 16QAM | 4 | 1 | 156 |
| 1344 | π/2 SHIFT 64QAM | 6 | 3 | 234 |

FIG. 6C

| L_CW(i_SS) | MODULATION SCHEME | N_BPSC(i_SS) | M(i_SS) |
|---|---|---|---|
| 624 | π/2 SHIFT BPSK | 1 | 1 |
| 624 | π/2 SHIFT QPSK | 2 | 2 |
| 624 | π/2 SHIFT 16QAM | 4 | 4 |
| 624 | π/2 SHIFT 64QAM | 6 | 6 |
| 672 | π/2 SHIFT BPSK | 1 | 1 |
| 672 | π/2 SHIFT QPSK | 2 | 2 |
| 672 | π/2 SHIFT 16QAM | 4 | 4 |
| 672 | π/2 SHIFT 64QAM | 6 | 6 |
| 1248 | π/2 SHIFT BPSK | 1 | 1 |
| 1248 | π/2 SHIFT QPSK | 2 | 1 |
| 1248 | π/2 SHIFT 16QAM | 4 | 2 |
| 1248 | π/2 SHIFT 64QAM | 6 | 3 |
| 1344 | π/2 SHIFT BPSK | 1 | 1 |
| 1344 | π/2 SHIFT QPSK | 2 | 1 |
| 1344 | π/2 SHIFT 16QAM | 4 | 2 |
| 1344 | π/2 SHIFT 64QAM | 6 | 3 |

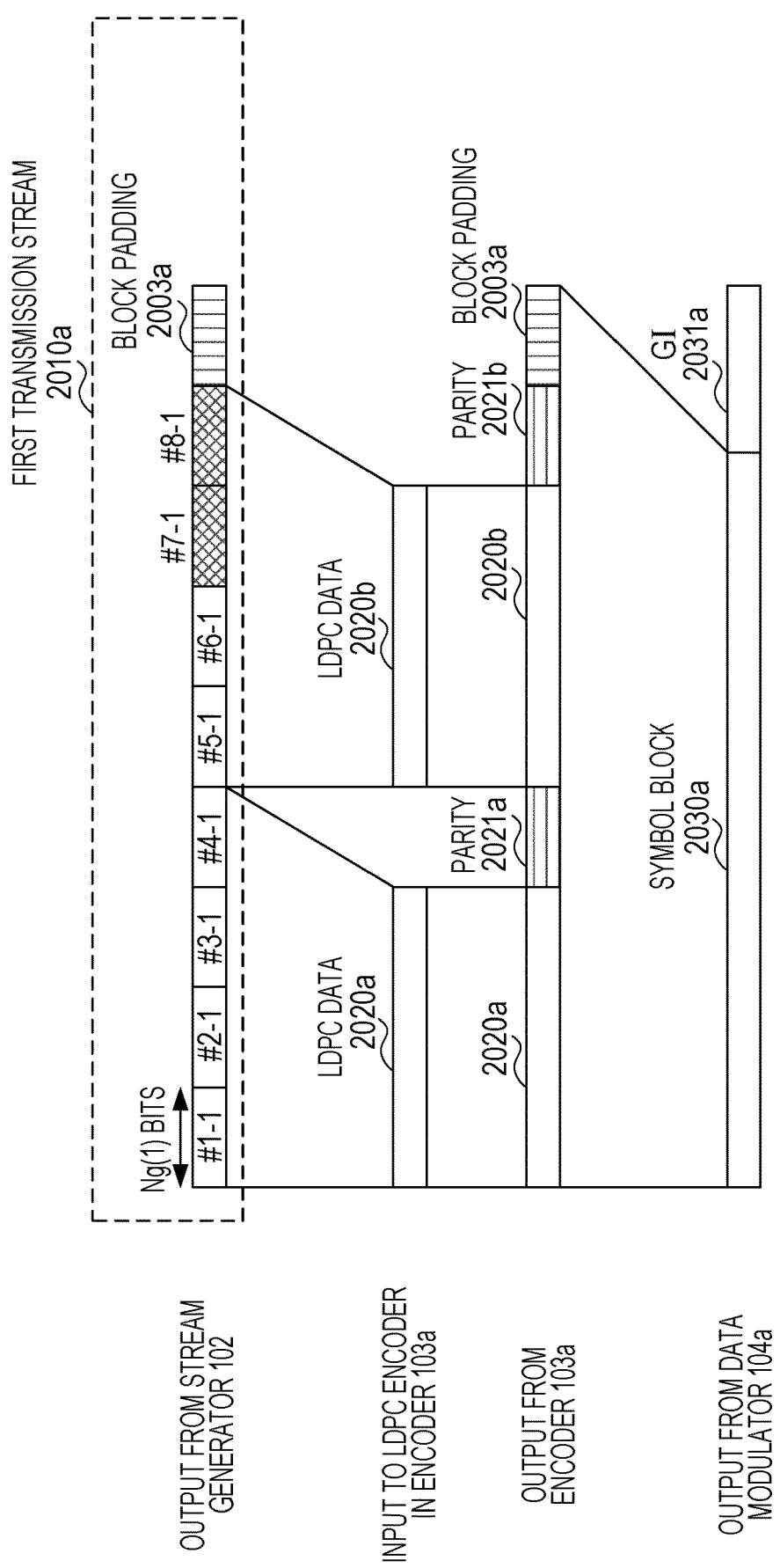

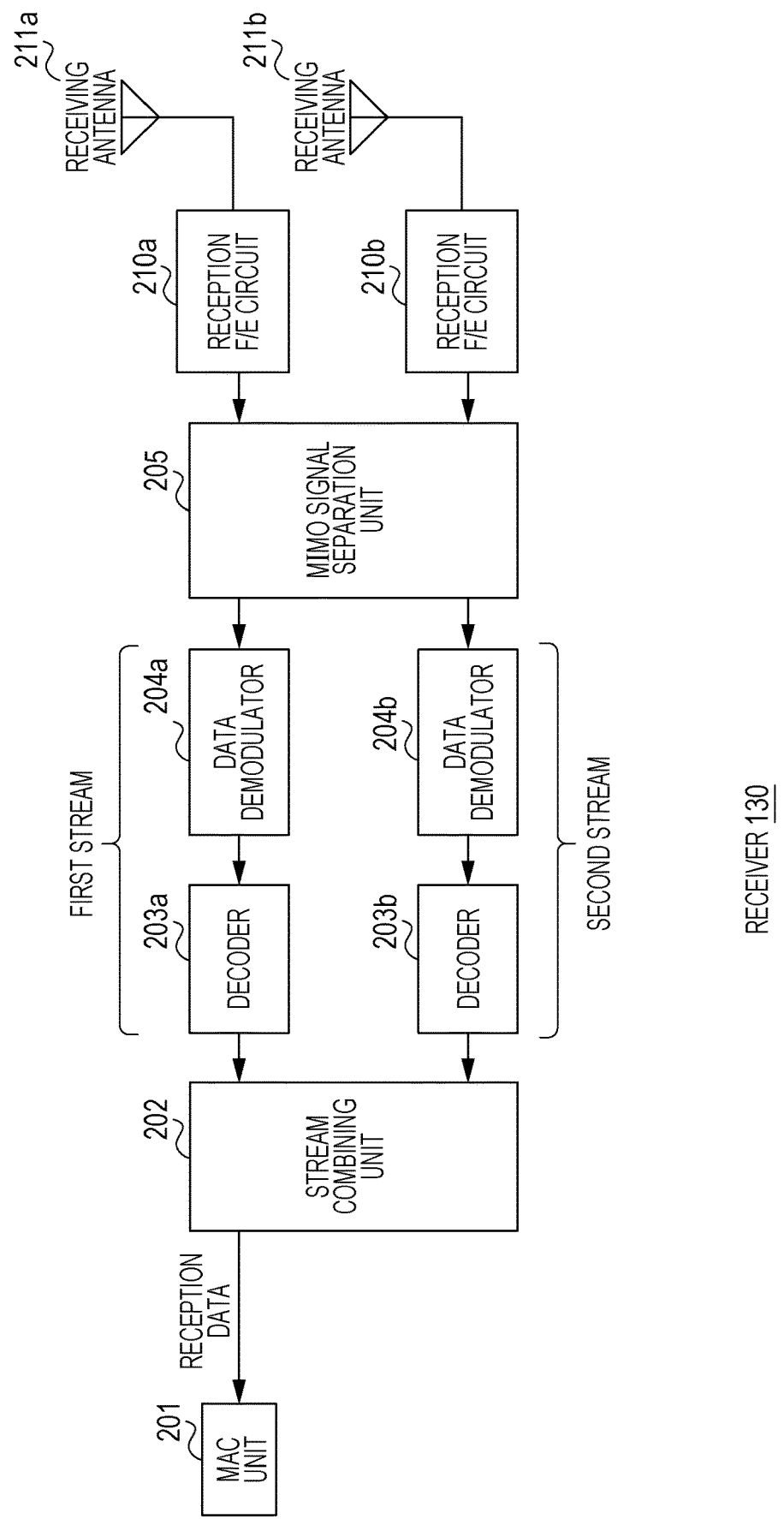

TRANSMISSION APPARATUS AND TRANSMISSION METHOD

TECHNICAL FIELD

The present disclosure relates to a transmission apparatus and a transmission method.

BACKGROUND ART

The IEEE 802.11ay standard (referred to as the "11ay standard") has been developed as a technique for achieving high-speed data transmission. In 11ay standard, the MIMO technique is applied to millimeter wave communication (refer to NPL 1).

NPL 1 describes one of techniques for dividing transmission data input from MAC into streams. In NPL 1, bits (M_bits(i)) proportional to the code rate (R(i)) and the number of bits per modulation symbol ($N_{BPSC}(i)$) are sequentially distributed to each of streams.

CITATION LIST

Non Patent Literature

NPL 1: IEEE 802.11-17/0211r1

SUMMARY OF INVENTION

Technical Problem

However, in NPL 1, study is insufficient to cope with an increase in the number of padding bits when the modulation scheme, code rate, and codeword size vary stream by stream.

The non-limiting example of the present disclosure provides a transmission apparatus and a transmission method capable of reducing the number of padding bits when at least one of the modulation scheme, the code rate, and the codeword size varies stream by stream.

Solution to Problem

According to one aspect, a transmission apparatus includes a stream generator that determines a size of padding data to be added to transmission data by using a group size of each of a plurality of transmission streams calculated on the basis of a code rate and a modulation scheme that are set for each transmission stream and the number of groups calculated from a size of the transmission data and the group size of the each transmission data, adds padding data having the determined size to the transmission data, and distributes the transmission data and the padding data to generate the plurality of transmission streams, an encoder that encodes each of the generated transmission streams with the code rate set for the transmission stream, a modulator that modulates each of the encoded transmission streams by using the modulation scheme set for the each transmission stream, and a radio transmitter that converts the modulated transmission streams into radio signals and transmits the radio signals from a plurality of transmitting antennas.

It should be noted that general or specific embodiments may be implemented as an apparatus, a method, an integrated circuit, a computer program, a storage medium, or any selective combination of a system, an integrated circuit, a computer program, and a storage medium.

Advantageous Effects of Invention

According to an aspect of the present disclosure, the number of padding bits can be reduced when at least one of the modulation scheme, the code rate, and the codeword size varies stream by stream.

BRIEF DESCRIPTION OF DRAWINGS

FIG. 6A is a diagram illustrating an example of the value of $M(i_{SS})$ when Y is 16 according to the present embodiment.

FIG. 6B is a diagram illustrating an example of the value of $M(i_{SS})$ when Y is 48 according to the present embodiment.

FIG. 6C is a diagram illustrating another example of the value of $M(i_{SS})$ when Y is 16 or 48 according to the present embodiment.

FIG. 7 is a diagram illustrating an example in which LDPC encoding, data modulation, and GI addition are performed on a transmission stream according to the present embodiment.

FIG. 8 is a diagram illustrating an example of the configuration of a receiving unit in the communication apparatus according to the present embodiment.

DESCRIPTION OF EMBODIMENTS

Figure 1:
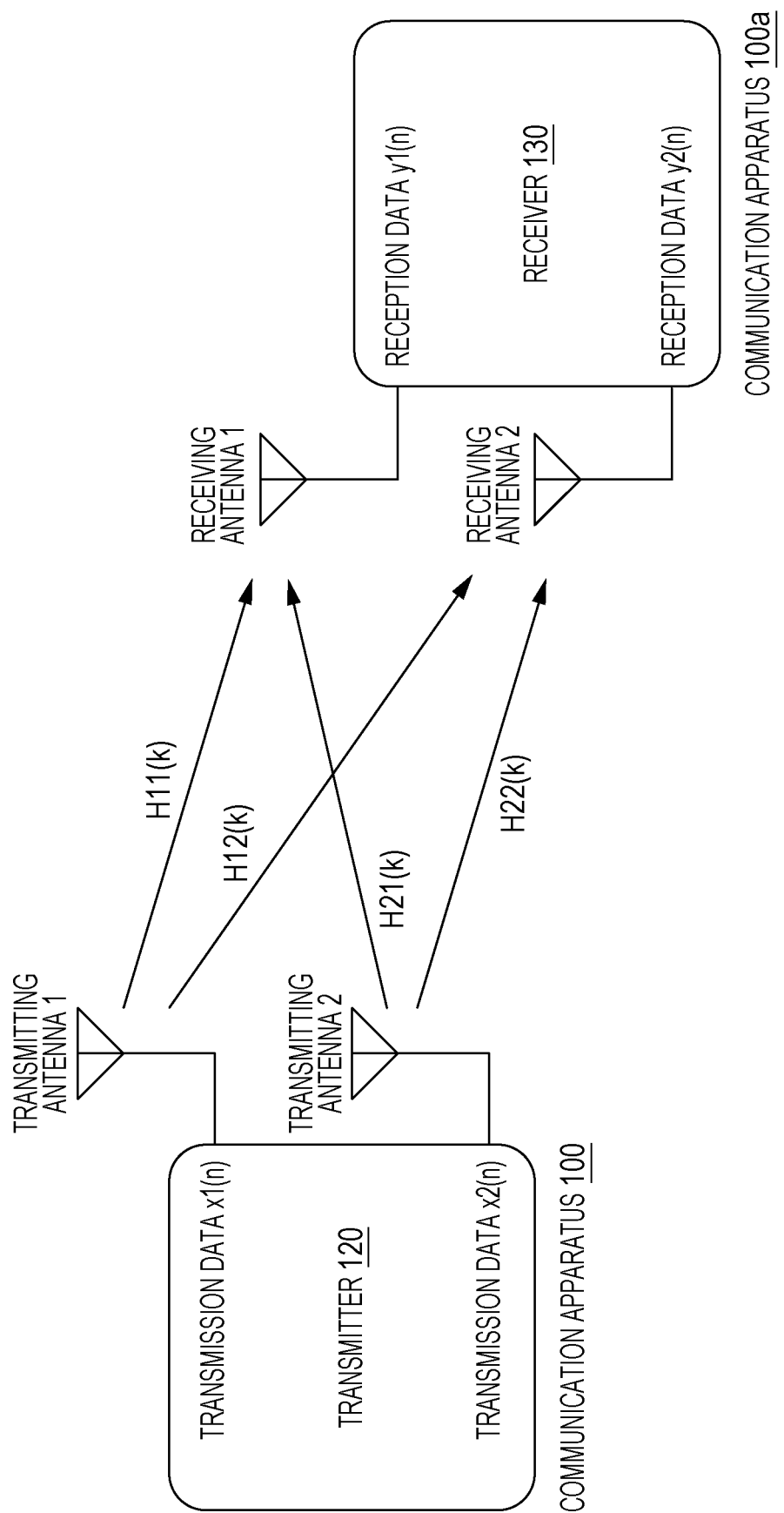
FIG. 1 is a diagram illustrating an example of the configuration of a MIMO communication system according to the present embodiment.

Embodiments of the present disclosure is described in detail below with reference to the accompanying drawings as appropriate. Note that too much description may be avoided. For example, detailed descriptions of already well-known matters and repeated descriptions for substantially the same configuration may be omitted. This is to avoid the following description from becoming unnecessarily redundant and to aid those skilled in the art in understanding the present invention.

The accompanying drawings and the following description are provided to enable those skilled in the art to fully understand the present disclosure and are not intended to limit the subject matter set forth in the appended claims.

In the case of distinguishing between elements of the same type in the description below, the reference numerals are used as follows: "encoder 103a" and "encoder 103b". However, in the case where distinction is not needed in the description, only common part of the reference numerals may be used (e.g., "encoder 103").

In the following description, the notation "XYZ unit" used for a constituent element of communication apparatuses 100 and 100a and a transmitter 120 may be replaced by another notation, such as "XYZ circuit (circuitry)", "XYZ apparatus", or "XYZ module".

For example, in NPL 1, a symbol block generator 105a sets $N_{BPSC}(i)$ to 1 when performing π/2 shift BPSK modulation, sets $N_{BPSC}(i)$ to 2 when performing π/2 shift QPSK modulation, sets $N_{BPSC}(i)$ to 4 when performing π/2 shift 16QAM modulation, and sets $N_{BPSC}(i)$ to 6 when performing π/2 shift 64QAM or 64NUC modulation.

The following equation (1) is an example of a mathematical expression for calculating M_bits(i):

[Formula 1]

$$M\_bits(i) = N_{BPSC}(i) \times R(i) \times 16 \qquad (1)$$

In Equation (1), i (i is an integer greater than or equal to 0) represents a stream number, and R(i) represents a code rate. In Equation (1), M_bits(i) is adjusted to an integer by multiplying the code rate R(i), which is a fraction, by 16 (×16).

The following Equation (2) is an example of an equation for calculating N_bits(i) indicating the number of bits distributed to the i-th stream on the basis of the codeword size:

[Formula 2]

$$\begin{aligned} N\_bits(i) &= N \times (N_{BPSC}(i) \times R(i) \times 16) \times (L_{CW1}/16) \qquad (2) \\ &= (N \times N_{BPSC}(i)) \times (R(i) \times L_{CW1}) \\ &= N \times M\_bits(i) \times (L_{CW1}/16) \end{aligned}$$

In Equation (2), $L_{CW1}$ represents a codeword size. N is a variable that is determined so that the sum of the number of bits of each of all the streams is greater than or equal to the number of transmission bits. That is, N is a variable that is determined so that a value obtained by summing N_bits(i) for all the streams is greater than or equal to a value obtained by summing M_bits(i) for all the streams. Note that if the sum of N_bits(i) is greater than the number of transmission bits, the bits corresponding to the difference are filled up with padding bits.

The second line of Equation (2) is an expression obtained by modifying the first line. "R(i)×$L_{CW1}$" represents the number of transmission bits (the number of information bits) per codeword. Thus, the second line of Equation (2) indicates that N_bits(i) includes "N×$N_{BPSC}(i)$" codewords. That is, N is a variable used to determine the number of codewords in each stream.

The third line of Equation (2) is an expression obtained by substituting Equation (1) for the first line of Equation (2). As can be seen from the third line of Equation (2), the process of allocating transmission data bits to each stream is performed in the manner described below. That is, the process of allocating M_bits(i) bits to the i-th stream is defined as a single process. The single process is repeated "N×$L_{CW1}$/16" times. In this manner, N_bits(i) is allocated to the i-th stream in total. After the bit allocation process is repeated "N×$L_{CW1}$/16" times and, thus, all of the transmission data bits are distributed, padding bits are distributed to each of the streams.

The number of symbols in the stream is calculated by dividing N_bits(i) by $N_{BPSC}(i) \times R(i)$. For this reason, Equation (2) is a calculation equation that makes the numbers of symbols in the streams the same.

In addition, the number of codewords $N_{CW}(i)$ in the i-th stream is calculated by dividing N_bits(i) by $L_{CW} \times R(i)$. Therefore, $N_{CW}(i)$ is calculated by the following equation (3):

[Formula 3]

$$N_{CW}(i) = N \times N_{BPSC}(i) \qquad (3).$$

For example, in the case of π/2 shift 16QAM modulation, since $N_{BPSC}(i)$ is 4, the number of codewords $N_{CW}(i)$ is a multiple of 4 from Equation (3). Note that $N_{CW}(i)$ calculated by Equation (3) is a multiple of $N_{BPSC}(i)$. For example, if $N_{CW\text{-}min}(i)$ that minimizes the number of padding bits is a value other than a multiple of 4 (for example, $N_{CW\text{-}min}(i)$ =37), $N_{CW}(i)$ is a value rounded up to a multiple of 4 (for example, $N_{CW}(i)$=40).

That is, $N_{CW}(i)$ calculated by Equation (2) and Equation (3) may be greater than $N_{CW}(i)$ that minimizes the number of padding bits. That is, the number of padding bits may increase. It is difficult to calculate $N_{CW}(i)$ that minimizes the number of padding bits by using Equation (2) and Equation (3).

For this reason, according to the technique described in NPL 1, if the modulation multi-level number $N_{BPSC}(i)$ is large, the number of padding bits may increase, and an unnecessary signal may be transmitted.

Furthermore, when a codeword size $L_{CW}(i)$ that varies stream by stream is applied, the following Equation (4) is used instead of Equation (2):

[Formula 4]

$$N\_bits(i) = N(i) \times (N_{BPSC}(i) \times R(i) \times 16) \times (L_{CW}(i)/16) \qquad (4).$$

N(i) is a variable that is determined such that the sum of bits of all the streams is greater than or equal to the number of transmission bits. However, unlike Equation (2), according to Equation (4), the codeword size varies stream by stream. Accordingly, the equation for calculating the set of N(i) values that minimizes the number of paddings needs to be determined in accordance with the set of codeword sizes. Thus, the amount of calculation increases.

First Embodiment

FIG. 1 is a diagram illustrating an example of the configuration of a MIMO communication system.

The transmitter 120 of the communication apparatus 100 includes a plurality of transmitting antennas. The transmitter 120 transmits different transmission data from the transmitting antennas at the same transmission slot timing (the same sampling timing in a D/A converter). A receiving unit 130 of the communication apparatus 100a, which is a communication partner, includes a plurality of receiving antennas, which receive reception data at the same receiving slot timing (the same sampling timing in an A/D converter). At this time, the channel delays are different. For this reason, transmission data transmitted by the transmitter 120 in the same transmission slot are not always received by the receiving unit 130 in the same reception slot. Note that n represents a transmission slot number and a reception slot number. k represents a frequency subcarrier number.

Figure 2:
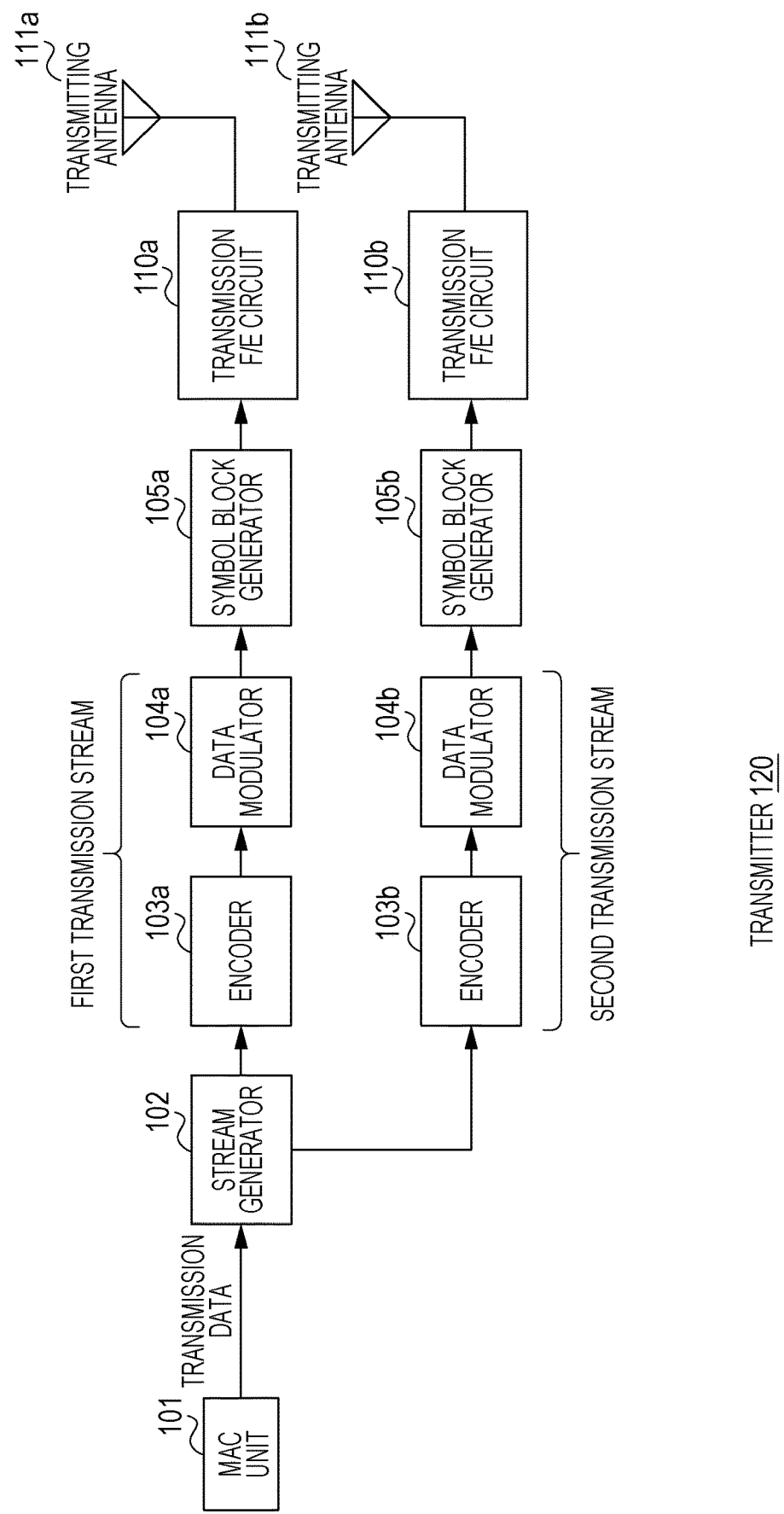
FIG. 2 is a diagram illustrating an example of the configuration of a transmitter in a communication apparatus according to the present embodiment.

FIG. 2 is a diagram illustrating an example of the configuration of the transmitter 120 of the communication apparatus 100.

The transmitter 120 includes a MAC unit 101, a stream generator 102, encoders 103a and 103b, data modulators 104a and 104b, symbol block generators 105a and 105b, transmission front end (F/E) circuits 110a and 110b, and transmitting antennas 111a and 11b.

According to the first embodiment, a case where the number of MIMO streams is 2 is described. However, the first embodiment is also applicable to the case where the number of MIMO streams is 1 or 2 or more. In the description below, $N_{SS}$ represents the number of MIMO streams ($N_{SS}$ is an integer greater than or equal to 1).

For example, when the number of MIMO streams is 4, the communication apparatus 100 may include four encoders 103 in parallel. Similarly, when performing MIMO transmission of $N_{SS}$ streams, the communication apparatus 100 may include $N_{SS}$ encoders 103, $N_{SS}$ data modulators 104, $N_{SS}$ symbol block generators 105, $N_{SS}$ transmission F/E circuits 110, and $N_{SS}$ transmitting antennas 111.

The MAC unit 101 generates transmission data and inputs the generated transmission data to the stream generator 102. In addition, the MAC unit 101 determines the transmission data size, the number of MIMO streams, the code rate of each stream, the LDPC codeword size of each stream, the modulation scheme of each stream, and the number of data symbols for each of symbol blocks and, thereafter, sends the determined information to the stream generator 102, the encoders 103a and 103b, the data modulators 104a and 104b, and the symbol block generators 105a and 105b.

The stream generator 102 performs bit scrambling on the transmission data. In addition, the stream generator 102 generates two types of padding bits, that is, data padding and block padding, and performs bit scrambling.

Subsequently, the stream generator 102 adds the data padding and block padding subjected to bit scrambling to the transmission data subjected to bit scrambling so as to generate transmission data with padding. Thereafter, the stream generator 102 divides the transmission data with padding into a first transmission stream and a second transmission stream. The stream generator 102 inputs the first transmission stream and the second transmission stream to the encoders 103a and 103b, respectively.

Note that the stream generator 102 distributes the data with padding to the transmission streams in accordance with at least one of the LDPC codeword size, the LDPC code rate, and the modulation scheme for each of the transmission streams.

Furthermore, when performing LDPC encoding on each of the transmission streams, the stream generator 102 adds data padding so that the size of the distributed transmission stream matches the LDPC codeword size.

In addition, when generating a symbol block in each of the transmission streams, the stream generator 102 adds block padding so that the size of the distributed transmission stream matches the symbol block size.

The encoders 103a and 103b perform error correction coding on transmission data and data padding included in the transmission stream and output the results to the data modulators 104a and 104b, respectively. The encoders 103a and 103b may use an LDPC (Low Density Parity Check) code as an error correction code.

In addition, the encoders 103a and 103b output the block padding included in the transmission stream to the data modulator 104 without performing error correction encoding. However, this is only an example, and the encoders 103a and 103b may perform error correction encoding on the block padding. Alternatively, instead of adding block padding, the encoder 103 may add (additional) error check code and error correction code for transmission data and data padding included in the transmission stream.

The data modulator 104 performs data modulation on the transmission stream encoded by the encoder 103 to generate transmission data symbols. As the data modulation scheme, the data modulator 104 may use, for example, one of π/2 shift BPSK (Binary Phase Shift Keying), π/2 shift QPSK (Quadrature Phase Shift Keying), π/2 shift 8PSK (8 point Phase Shift Keying), π/2 shift 16QAM(16 points Quadrature Amplitude Modulation), π/2 shift 64QAM(64 points QAM), and π/2 shift 64NUC (64 points Non-Uniform Constellation). Note that the transmission stream encoded by the encoder 103 includes distributed transmission data, data padding, and block padding, as described above.

The symbol block generator 105 divides the transmission data symbols generated by the data modulator 105 into segments each having a predetermined number of symbols (hereinafter referred to as "$N_{SPB}$") and inserts a guard interval symbol (hereinafter referred to as a "GI") into every segment. $N_{SPB}$ is, for example, 448 symbols. A symbol sequence that is a combination of $N_{SPB}$ transmission data symbols and GIs is referred to as a symbol block.

Note that in the case of transmission using a 2.16-GHz channel, the number of symbols per symbol block may be determined as $N_{SPB}$. In the case of transmission using 2.16×$N_{CB}$-GHz ($N_{CB}$ is an integer greater than or equal to 1) channel (referred to as channel bonding), the number of symbols per symbol block may be determined as $N_{SPB} \times N_{CB}$. $N_{CB}$ is called the number of channel bonding.

The transmission F/E circuit 110 includes digital and analog filters, a D/A conversion (digital/analog conversion) circuit, and an RF (Radio Frequency) circuit. For this reason, the transmission F/E circuit may be referred to as a "filter-D/A conversion-RF circuit". As the digital filter, for example, an RRC (Root Raised Cosine) filter is used. The transmission F/E circuit 110 generates a signal (referred to as an RF signal) by performing filter processing, D/A conversion processing, RF signal conversion (up-conversion), and power amplification and inputs the RF signal to the transmitting antennas 111.

The transmitting antenna 111 transmits the RF signal generated by the transmission F/E circuit 110 to another communication apparatus (for example, the communication apparatus 100a) in the form of a radio signal.

Figure 3:
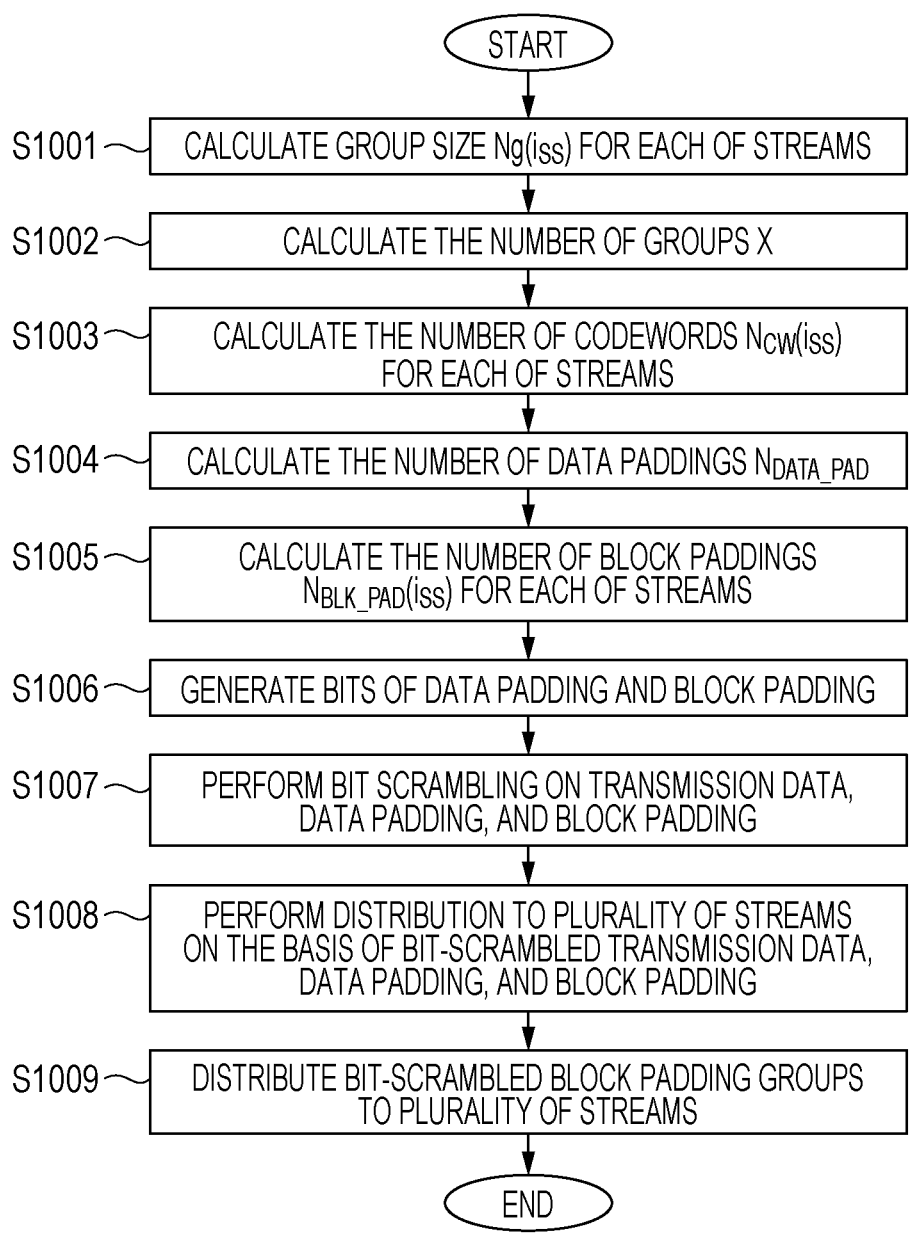
FIG. 3 is a flowchart illustrating an example of the processing performed by a stream generator according to the present embodiment.

FIG. 3 is a flowchart illustrating an example of the processing performed by the stream generator 102.

In the processing illustrated in FIG. 3, the stream generator 102 calculates the group size and the number of groups and determines the number of data paddings and the number of block paddings. In this manner, even when at least one of the modulation scheme, code rate, and codeword size varies transmission stream by transmission stream, the number of paddings can be reduced. That is, the data throughput can be improved.

As compared with the technique described in NPL 1 (refer to Equation (3)) that calculates the number of codewords in each transmission stream by using the variable N, according to the present embodiment, the number of codewords that minimizes the number of padding bits can be calculated without restriction that the number of codewords is a multiple of $N_{BPSC}(i)$. In this way, the present embodiment can reduce the number of paddings.

The processing performed in FIG. 3 is described below.

In step S1001, the stream generator 102 calculates a group size $Ng(i_{SS})$ for each of transmission streams on the basis of the following Equation (5):

[Formula 5]

$$Ng(i_{SS}) = N_{BPSC}(i_{SS}) \times R(i_{SS}) \times 16 \qquad (5).$$

where $i_{SS}$ represents the stream number and is an integer greater than or equal to 1 and less than or equal to $N_{SS}$.

In Equation (5), $N_{BPSC}(i_{SS})$ represents the number of bits per constellation point in the $i_{SS}$-th transmission stream. $R(i_{SS})$ represents the code rate of the LDPC code in the $i_{SS}$-th transmission stream.

For example, when the symbol block generator 105a (corresponding to a first transmission stream, that is, $i_{SS}$ of 1) performs π/2 shift BPSK modulation, the value of $N_{BPSC}$(1) is 1. When the symbol block generator 105a performs π/2 shift QPSK modulation, the value of $N_{BPSC}$(1) is 2. When the symbol block generator 105a performs π/2 shift 8PSK modulation, the value of $N_{BPSC}$(1) is 3. When the symbol block generator 105a performs π/2 shift 16QAM modulation, the value of $N_{BPSC}$(1) is 4. When the symbol block generator 105a performs π/2 shift 64QAM or 64NUC modulation, the value of $N_{BPSC}$(1) is 6.

In step S1002, the stream generator 102 calculates the number of groups X on the basis of the following Equation (6):

[Formula 6]

$$X = \left\lceil \frac{\text{Length} \times 8}{\sum_{i_{ss}=1}^{N_{ss}} Ng(i_{ss})} \right\rceil. \quad (6)$$

Note that the ceiling function in Equation (6) is a function that outputs the smallest integer greater than or equal to m with respect to the real number m.

In Equation (6), Length represents the size of transmission data (in octet). As can be seen from Equation (6), to obtain the number of groups X, a value is obtained by multiplying the size of transmission data by 8 to convert the size into the number of bits (the numerator of Equation (6)). Thereafter, the obtained value is divided by the sum of the group sizes $Ng(i_{SS})$ of all the transmission streams (the denominator of Equation (6)). Finally, the result of the division is rounded up to an integer. The number of groups X is described in more detail below.

In step S1003, the stream generator 102 calculates the number of codewords $N_{CW}(i_{SS})$ for each of the transmission streams on the basis of the following Equation (7):

[Formula 7]

$$N_{CW}(i_{ss}) = \left\lceil \frac{X \times Ng(i_{ss})}{L_{CW}(i_{ss}) \times R(i_{ss})} \right\rceil. \quad (7)$$

The stream generator 102 temporarily determines that data of a maximum of $X \times Ng(i_{SS})$ bits is distributed to each of the transmission streams and calculates the number of codewords that can include $X \times Ng(i_{SS})$ bits. That is, since the number of bits included in one codeword is $L_{CW}(i_{SS}) \times R(i_{SS})$, the stream generator 102 divides $X \times Ng(i_{SS})$ by $L_{CW}(i_{SS}) \times R(i_{SS})$ and rounds up the resultant value to an integer, as indicated by Equation (7). In this manner, the stream generator 102 calculates the number of codewords $N_{CW}(i_{SS})$.

In step S1004, the stream generator 102 calculates the number of data paddings (number of bits) $N_{DATA\_PAD}$ on the basis of the following Equation (8):

[Formula 8]

$$N_{DATA\_PAD} = \sum_{i_{ss}=1}^{N_{ss}} (N_{CW}(i_{ss}) \times L_{CW}(i_{ss}) \times R(i_{ss})) - \text{Length} \times 8 \quad (8)$$

$N_{CW}(i_{SS}) \times L_{CW}(i_{SS}) \times R(i_{SS})$ in Equation (8) indicates the number of bits included in the codewords equal in number to the number calculated for the transmission stream in step S1003. That is, as can be seen from Equation (8), the stream generator 102 subtracts a value obtained by converting the size of transmission data into the number of bits from the sum of the numbers of bits included in the number of codewords of all the transmission streams. In this way, the stream generator 102 calculates the number of data paddings (the number of bits) $N_{DATA\_PAD}$.

In step S1005, the stream generator 102 calculates the number of symbol blocks $N_{BLKS}$ on the basis of the following Equation (9). Furthermore, the stream generator 102 calculates the number of block paddings (the number of bits) $N_{BLK\_PAD}(i_{SS})$ for each of the transmission streams on the basis of the following Equation (10).

[Formula 9]

$$N_{BLKS} = \left\lceil \max_{i_{ss}=1}^{N_{ss}} \left( \frac{N_{CW}(i_{ss}) \times L_{CW}(i_{ss})}{N_{BPSC}(i_{ss}) \times N_{SPB} \times N_{CB}} \right) \right\rceil. \quad (9)$$

[Formula 10]

$$N_{BLK\_PAD}(i_{ss}) = \quad (10)$$
$$N_{SPB} \times N_{CB} \times N_{BLKS} \times N_{BPSC}(i_{ss}) - N_{CW}(i_{ss}) \times L_{CW}(i_{ss}).$$

In Equation (9), $N_{CW}(i_{SS}) \times L_{CW}(i_{SS})/N_{BPSC}(i_{SS})$ represents the number of data symbols included in the codewords equal in number to the number calculated for the $i_{SS}$-th transmission stream in step S1003. The stream generator 102 divides the number of data symbols included in the codewords by the number of data symbols per symbol block $N_{SPB} \times N_{CB}$ on the basis of Equation (9). In this manner, the stream generator 102 calculates the number of symbol blocks necessary for the transmission stream. The stream generator 102 calculates the necessary number of symbol blocks for each of the transmission streams and defines the largest number of symbol blocks among the calculated numbers as the number $N_{BLKS}$ of symbol blocks of a transmission packet.

The stream generator 102 subtracts the number of data symbols included in $N_{CW}(i_{SS})$ codewords from the number of data symbols per $N_{BLKS}$ symbol blocks on the basis of Equation (10). In this way, the stream generator 102 calculates the number of block paddings (the number of bits) $N_{BLK\_PAD}(i_{SS})$ in the $i_{SS}$-th transmission stream.

In step S1006, the stream generator 102 generates transmission data with padding. That is, the stream generator 102 generates a bit sequence with the data padding and block padding calculated in the above-described manner.

Figure 4:
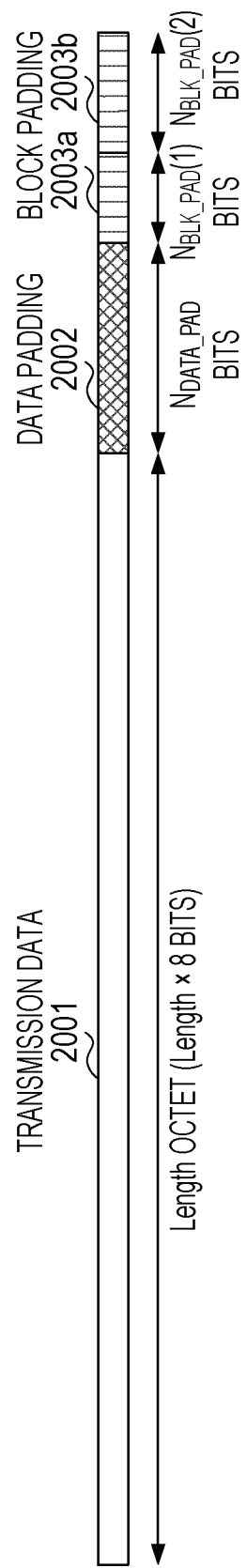
FIG. 4 is a diagram illustrating an example of transmission data with padding according to the present embodiment.

FIG. 4 is a diagram illustrating an example of transmission data with padding generated by the stream generator 102 in step S1006. Step S1006 is described in detail below with reference to FIG. 4.

The stream generator 102 generates $N_{DATA\_PAD}$-bit data padding 2002 and appends the data padding 2002 to the transmission data 2001. In addition, the stream generator 102 generates $N_{BLK\_PAD}(1)$-bit block padding 2003a for the first transmission stream and appends the block padding 2003a to the data padding 2002. Furthermore, the stream generator 102 generates $N_{BLK\_PAD}(2)$-bit block padding 2003b for the second transmission stream and appends the block padding 2003b to the block padding 2003a. That is, the stream generator 102 sequentially adds $N_{BLK\_PAD}(1)$-bit to $N_{BLK\_PAD}(N_{SS})$-bit block padding 2003 in accordance with the number of streams $N_{SS}$.

Note that the stream generator 102 may use a bit sequence consisting of bits 0 as the data padding 2002 and the block padding 2003. For example, the stream generator 102 appends, as the data padding 2002, $N_{DATA\_PAD}$ bits 0 to the transmission data 2001 (that is, a bit sequence consisting of bits 0 and 1).

Referring back to FIG. 3, in step S1007, the stream generator 102 performs bit scrambling on the transmission data with padding. To perform the bit scrambling, the stream generator 102 may handle the transmission data 2001, the data padding 2002, and the block padding 2003 as a series of data without distinction. That is, the stream generator 102 need not initialize a scrambler at the head of the data padding 2002 and at the head of the block padding 2003.

In step S1008, the stream generator 102 divides the scrambled transmission data with padding into transmission streams and inputs the divided streams to the encoders 103a and 103b.

Figure 5:
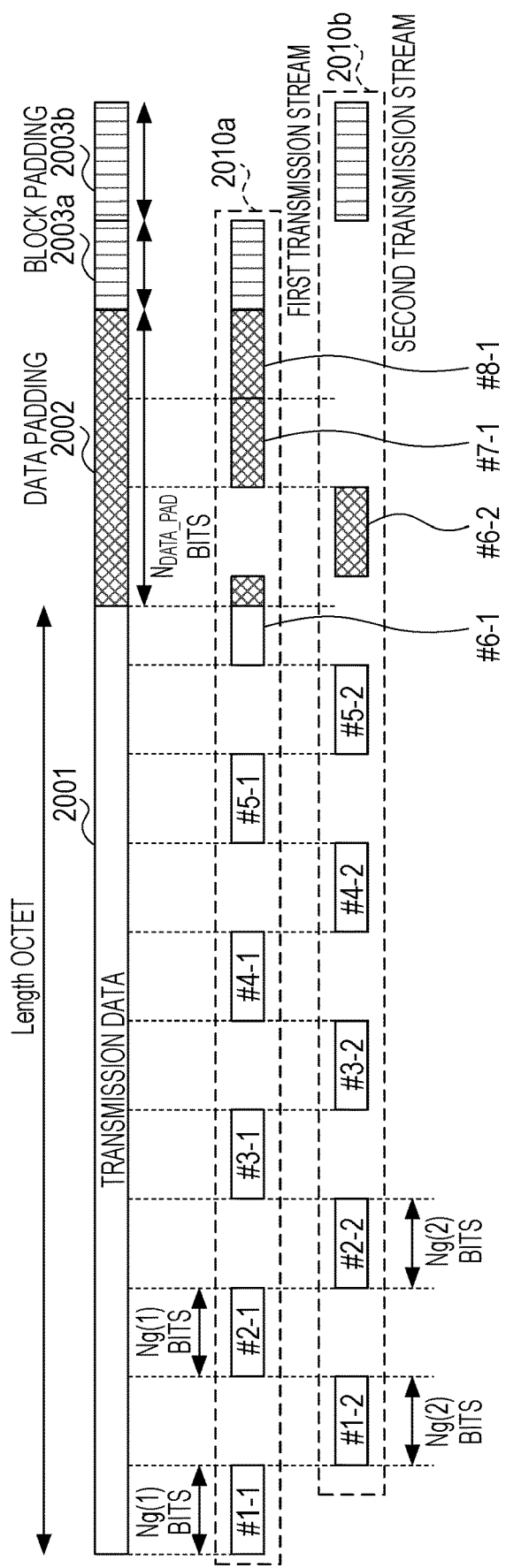
FIG. 5 is a diagram illustrating an example of stream dividing processing according to the present embodiment.

FIG. 5 is a diagram illustrating an example of a stream dividing process performed by the stream generator 102. Step S1008 is described in detail below with reference to FIG. 5.

The stream generator 102 extracts Ng(1) bits from the transmission data 2001 and distributes the bits to the first transmission stream 2010a first (refer to #1-1 in FIG. 5). Subsequently, the stream generator 102 extracts Ng(2) bits from the transmission data 2001 and distributes the bits to the second transmission stream 2010b (refer to #1-2 in FIG. 5). The stream generator 102 repeats the process of sequentially distributing $Ng(i_{SS})$ bits to the first transmission stream through the $N_{SS}$-th transmission stream at least "$N_{SS} \times X$" times (refer to #1-1 to #6-2 in FIG. 5, and refer to Equation (6) for the value X).

The stream generator 102 repeats the process of sequentially distributing $Ng(i_{SS})$ bits to each of the transmission streams "$N_{SS} \times X$" times. Subsequently, the stream generator 102 regards the transmission stream to which the number of bits corresponding to $N_{CW}(i_{SS})$ codewords is distributed as a sign of completion. For example, in terms of the second transmission stream 2010b illustrated in FIG. 5, the number of bits included in the distributed X groups (#1-2, #2-2, #3-2, #4-2, #5-2, #6-2) is equal to the number of bits corresponding to $N_{CW}(i_{SS})$ codewords (that is, $N_{CW}(i_{SS}) \times L_{CW}(i_{SS}) \times R(i_{SS})$). Accordingly, the stream generator 102 determines that allocation of group #6-2 is the sign of completion.

After repeating the process $N_{SS} \times X$ times, the stream generator 102 ends distribution to the completed transmission stream and continues distribution to the uncompleted transmission streams. For example, in FIG. 5, the stream generator 102 ends the distribution to the second transmission stream 2010b after allocation of #6-2 and continues distribution to the first transmission stream 2010a. That is, the stream generator 102 distributes #7-1 and #8-1 to the first transmission stream 2010a. In other words, the stream generator 102 skips distribution to the already completed second transmission stream (for example, skips the distribution of #7-2 and #8-2) and continues the distribution process until the distribution of the data padding 2002 is completed.

Referring back to FIG. 3, in step S1009, the stream generator 102 distributes the block padding 2003a and the block padding 2003b (refer to FIG. 5) to the transmission streams and inputs the transmission streams to the encoders 103a and 103b, respectively. As calculated in step S1005, the number of block paddings distributed to the $i_{SS}$-th transmission stream is $N_{BLK\_PAD}(i_{SS})$. Accordingly, for example, the stream generator 102 distributes first $N_{BLK\_PAD}(1)$ bits of the block padding (the block padding. 2003a) to the first transmission stream and outputs the first transmission stream to the encoder 103a. In addition, the stream generator 102 distributes $N_{BLK\_PAD}(2)$ bits following the block padding 2003a (the block padding 2003b) to the second transmission stream and outputs the second transmission stream to the encoder 103b.

In step S1001, the stream generator 102 may use the following Equation (11), instead of using Equation (5):

[Formula 11]

$$Ng(i_{SS}) = N_{BPSC}(i_{SS}) \times R(i_{SS}) \times 56 \qquad (11).$$

When the value of $L_{CW}(i_{SS})$ is 672 or 1344, the stream generator 102 can increase the group size by using Equation (7), as compared with Equation (5). Furthermore, the transmission data with padding can be regularly distributed to the transmission streams (described in more detail later). In this way, a circuit scale can be reduced, and power consumption can be reduced.

When the value of $L_{CW}(i_{SS})$ is 624 or 1248, the stream generator 102 may replace the value 56 in Equation (7) with the value 52. In this manner, the stream generator 102 can regularly distribute the transmission data with padding to the transmission streams (described in more detail later). As a result, a circuit scale can be reduced, and power consumption can be reduced.

When the value of $L_{CW}(i_{SS})$ is 672 or 1344, the stream generator 102 may use Equation (7). When the value of $L_{CW}(i_{SS})$ is 624 or 1248, the stream generator 102 may replace the value 56 in Equation (11) with the value 52. When the values of $L_{CW}(i_{SS})$ include 624, 672, 1248, and 1344, the stream generator 102 may use Equation (5).

In step S1001, the stream generator 102 may use the following Equation (12), instead of using Equation (5):

[Formula 12]

$$Ng(i_{SS}) = N_{BPSC}(i_{SS}) \times R(i_{SS}) \times L_{CW}(1) \qquad (12).$$

The stream generator 102 can reduce the number of data paddings in the first transmission stream by using Equation (12). When the value of $L_{CW}(i_{SS})$ is 672 or 1344 or when the value of $L_{CW}(i_{SS})$ is 624 or 1248 (that is, when the values of $L_{CW}(i_{SS})$ include either 672 or 624 and when the values of $L_{CW}(i_{SS})$ include either 1344 or 1248), the stream generator 102 can reduce the number of block paddings.

In Equation (7), $L_{CW}(i_{SS})$ is the LDPC codeword size for the $i_{SS}$-th transmission stream. According to the 11ay standard, the value used for $L_{CW}(i_{SS})$ is, for example, 624, 672, 1248, or 1344. $L_{CW}(1)$ represents the LDPC codeword size of the first transmission stream.

In step S1001, the stream generator 102 may use the following Equation (13), instead of using Equation (5):

[Formula 13]

$$Ng(i_{SS}) = N_{BPSC}(i_{SS}) \times R(i_{SS}) \times Y \qquad (13).$$

In Equation (13), the value of Y may be 16, 48, or $L_{CW}(1)$. Alternatively, the stream generator 102 may determine the value of Y such that the value of $Y \times N_{BPSC}(i_{SS})$ is a divisor of $L_{CW}(i_{SS})$. For example, when $L_{CW}(1)$ is 672 and the value of $N_{BPSC}(i_{SS})$ is 4, the stream generator 102 may set the value of Y in Equation (13) to any one of the divisors of 168 ($=L_{CW}(i_{SS})/N_{BPSC}(i_{SS})=672/4$) (for example, 26).

The communication apparatus 100 determines that the value of Y is 56 (equivalent to Equation (6)). As a result, if the value of $L_{CW}(i_{SS})$ is, for example, 672 or 1344 and if the value of $N_{BPSC}(i_{SS})$ is any one of 1, 2, 4 and 6, the above-described condition (the value of $Y \times N_{BPSC}(i_{SS})$ is a divisor of $L_{CW}(i_{SS})$) is satisfied for any combination of $L_{CW}(i_{SS})$ and $N_{BPSC}(i_{SS})$.

By determining the value of Y in Equation (13) such that the value of $Y \times N_{BPSC}(i_{SS})$ is a divisor of $L_{CW}(i_{SS})$, an integer multiple of the group size is the same as the number of bits of one codeword. Accordingly, in step S1008, the stream generator 102 can regularly distribute the transmission data with padding to the transmission stream without leaving a remainder of transmission bits less than the group size of the transmission stream. As a result, the circuit scale can be reduced, and power consumption can be reduced.

For example, when $L_{CW}(1)$ is 672 and the value of $N_{BPSC}(i_{SS})$ is 4 (corresponding to π/2 shift 16QAM), Equation (5) provides a combination that does not satisfy the above-described condition (the value of $Y \times N_{BPSC}(i_{SS})$ is a divisor of $L_{CW}(i_{SS})$). For example, Y of 4 corresponds to such a case, and 672 is not divisible by 16×4. For this reason, when distribution of the transmission data to the transmission stream is performed in step S1008, the transmission stream has unused transmission bits less than the group size.

Furthermore, for example, when $L_{CW}(1)$ is 624 and the value of $N_{BPSC}(i_{SS})$ is 6 (corresponding to π/2 shift 64QAM), Equation (5) provides a combination that does not satisfy the above-described condition (the value of $Y \times N_{BPSC}(i_{SS})$ is a divisor of $L_{CW}(i_{SS})$).

To regularly distribute the transmission data to the transmission streams, when the value of $N_{BPSC}(i_{SS})$ is 4 (corresponding to π/2 shift 16QAM) and the $L_{CW}(i_{SS})$ value is 624, the stream generator 102 may calculate the number of codewords $N_{CW}(i_{SS})$ by using the following equation (14), instead of using Equation (7):

[Formula 14]

$$N_{CW}(i_{ss}) = \left\lceil \frac{X \times Ng(i_{ss})/2}{L_{CW}(i_{ss}) \times R(i_{ss})} \right\rceil \times 2. \quad (14)$$

In Equation (14), $N_{CW}(i_{SS})$ is greater than or equal to $N_{CW}(i_{SS})$ calculated by Equation (7) and is an even number. By using Equation (14), the stream generator 102 can regularly distribute the transmission data with padding to the transmission streams without producing unused transmission bits less than the group size in the transmission stream in step S1008, even when π/2 shift 16QAM is used and the value of $L_{CW}(i_{SS})$ is 624.

When using Equation (14), the stream generator 102 determines the value of Y such that the value of $Y \times N_{BPSC}(i_{SS})$ is a divisor of $L_{CW}(i_{SS}) \times 2$.

To satisfy the condition that the number of codewords $N_{CW}(i_{SS})$ is a multiple of $M(i_{SS})$, the stream generator 102 may calculate the number of codewords $N_{CW}(i_{SS})$ by using the following Equation (15) instead of using Equation (10):

[Formula 15]

$$N_{CW}(i_{ss}) = \left\lceil \frac{X \times Ng(i_{ss})/M(i_{ss})}{L_{CW}(i_{ss}) \times R(i_{ss})} \right\rceil \times M(i_{ss}). \quad (15)$$

Note that the value of $M(i_{SS})$ is an integer greater than or equal to 1 and may vary transmission stream by transmission stream.

When using Equation (15), the stream generator 102 determines the value of $Y \times N_{BPSC}(i_{SS})$ so that the value of $Y \times N_{BPSC}(i_{SS})$ is a divisor of $L_{CW}(i_{SS}) \times M(i_{SS})$. Thus, in step S1008, the stream generator 102 can regularly distribute the transmission data with padding to the transmission streams without producing unused transmission bits less than the group size in the transmission stream.

Furthermore, by using Equation (13), the group size increases and the number of groups X decreases in accordance with the value of Y. As a result, data transfer control is facilitated in distribution of the transmission data to the transmission streams, and the circuit scale can be reduced.

However, in some cases, if the value of Y is increased, the number of codewords calculated by Equation (15) increases and, thus, the number of data paddings increases. As a result, the transmission data rate may decrease and, thus, the radio transmission efficiency may decrease.

A method is described below with reference to FIGS. 6A, 6B, and 6C for preventing an increase in the number of codewords and the number of data paddings by using a small $M(i_{SS})$ value used for the value of Y.

For example, the stream generator 102 sets the value of $M(i_{SS})$ in Equation (15) to a value the same as the value of $N_{BPSC}(i_{SS})$. In this case, the value of Y is determined to be a divisor of $L_{CW}(i_{SS})$. For example, if the values of $L_{CW}(i_{SS})$ include 672 and 624, the value of Y is set to 48 which is a common divisor of 672 and 624.

Alternatively, the stream generator 102 may determine the value of $M(i_{SS})$ in accordance with the LDPC codeword size and the modulation scheme. FIG. 6A illustrates an example of the values of $M(i_{SS})$ when Y is 16. FIG. 6B illustrates an example of the values of $M(i_{SS})$ when Y is 48. FIG. 6C illustrates another example of the values of $M(i_{SS})$ when Y is 16 or 48.

In FIG. 6A, FIG. 6B, and FIG. 6C, the column with header "L_CW(i_SS)" contains the codeword size $L_{CW}(i_{SS})$. The column with header "modulation scheme" contains a data modulation scheme. The column with header "N_BPSC (i_SS)" contains the value of $N_{BPSC}(i_{SS})$ corresponding to the data modulation scheme stored in the column with header "modulation scheme". The column with header "M(i_SS)" contains an example of the value of $M(i_{SS})$ corresponding to the values stored in the column with header "$L_{CW}$(i_SS)" and the column with header "N_BPSC(i_SS)". As an example, the column with header "Ng(i_SS) (when R=13/16)" contains an example of the value of $Ng(i_{SS})$ corresponding to the values stored in the column with header "$L_{CW}$(i_SS)" and the column with header "N_BPSC(i_SS) when the code rate is 13/16. Note that when the data modulation scheme is π/2 shift 8PSK, the code rate 13/16 is not defined. For this reason, the value of $Ng(i_{SS})$ when the code rate is 5/6 is displayed.

The stream generator 102 determines a combination of Y and $M(i_{SS})$ that satisfies the condition that the value of $Y \times N_{BPSC}(i_{SS})$ is a divisor of $L_{CW}(i_{SS}) \times M(i_{SS})$.

A specific example illustrated in FIG. 6A is described below. When $L_{CW}(i_{SS})$ is 624 and the modulation scheme is π/2 shift BPSK, $N_{BPSC}(i_{SS})=1$. Accordingly, $Y \times N_{BPSC}(i_{SS})=16 \times 1=16$. $L_{CW}(i_{SS}) \times M(i_{SS})=624 \times 1=16 \times 39$. Therefore, the condition is satisfied. When $L_{CW}(i_{SS})$ is 624 and the modulation scheme is π/2 shift 64QAM, $N_{BPSC}(i_{SS})=6$. Accordingly, $Y \times N_{BPSC}(i_{SS})=16 \times 6=96$, and $L_{CW}(i_{SS}) \times M(i_{SS})=624 \times 2=96 \times 13$. Therefore, the condition is satisfied. When $L_{CW}(i_{SS})$ is 672 and the modulation scheme is π/2 shift 16QAM, $N_{BPSC}(i_{SS})=4$. Accordingly, $Y \times N_{BPSC}(i_{SS})=16 \times 4=64$, and $L_{CW}(i_{SS}) \times M(i_{SS})=672 \times 2=64 \times 21$. Therefore, the condition is satisfied. When $L_{CW}(i_{SS})$ is 504 and the modulation scheme is π/2 shift 8PSK, $N_{BPSC}(i_{SS})$=3. Accordingly, $Y \times N_{BPSC}(i_{SS})$ =16×3=48, and $L_{CW}(i_{SS}) \times M(i_{SS})$=504×2=48×21. Therefore, the condition is satisfied.

For example, the stream generator 102 refers to FIG. 6A, FIG. 6B, or FIG. 6C and selects, as $M(i_{SS})$, a small integer (for example, 1, 2, 3, 4, or 6) in accordance with the LDPC codeword size and the data modulation scheme. In this manner, the number of codewords calculated by Equation (15) can be reduced, and the number of data paddings can be reduced.

A large Y value (for example, 48) is used in FIG. 6B, as compared with that in FIG. 6A. As a result, by referring to FIG. 6B, the stream dividing process in step S1008 illustrated in FIG. 3 is simplified, and the circuit scale can be reduced.

In addition, in FIG. 6C, when the values of $L_{CW}(i_{SS})$ are 468 (not illustrated), 504 (not illustrated), 624, and 672, the values of $M(i_{SS})$ corresponding to the same value of $N_{BPSC}(i_{SS})$ are the same. Similarly, when the values of $L_{CW}(i_{SS})$ are 936 (not illustrated), 1008 (not illustrated), 1248, and 1344, the values of $M(i_{SS})$ corresponding to the same value of $N_{BPSC}(i_{SS})$ are the same. For example, in the case of π/2 shift 16QAM, the value of $M(i_{SS})$ is 4 regardless of whether $L_{CW}(i_{SS})$ is 624 or 672. As a result, the control performed by the stream generator 102 is facilitated, and the circuit scale can be reduced. For example, when the value of $M(i_{SS})$ defined in FIG. 6C is used, transmission streams having the same value of $L_{CW}(i_{SS})$ have the same number of block paddings. As a result, the need for calculating the number of block puddings can be eliminated.

Examples of the values of the group size $Ng(i_{SS})$, the number of groups X, the number of data paddings $N_{DATA\_PAD}$, and the number of block paddings $N_{BLK\_PAD}(i_{SS})$ calculated by the stream generator 102 are described below with reference to FIG. 7.

The number of transmission data is set to 284, the LDPC codeword size of the first transmission stream ($L_{CW}(1)$) is set to 1344, the LDPC code rate (R(1)) is set to 3/4, and the modulation scheme is set to iπ/2 shift 64QAM ($N_{BPSC}(1)$ is 6). In addition, the LDPC codeword size of the second transmission stream ($L_{CW}(2)$) is set to 672, the LDPC code rate (R(2)) is set to 13/16, and the modulation scheme is set to iπ/2 shift 16QAM ($N_{BPSC}(1)$ is 4).

In addition, Y in Equation (13) is set to 56, and $M(i_{SS})$ in Equation (15) is set to 1. In this case, as can be seen from Equation (13), the group size Ng(1) of the first transmission stream is 252 (=6×3/4×56). Furthermore, as can be seen from Equation (13), the group size Ng(2) of the second transmission stream is 182 (=4×13/16×56).

As can be seen from Equation (6), the number of groups X is 6 (=ceiling(284×8/(252+182)).

As can be seen from Equation (15), the number of code blocks $N_{CW}(1)$ of the first transmission stream is 2 (=ceiling ((6×252/1)/(1344× (3/4)))×1). Furthermore, as can be seen from Equation (7), the number of code blocks $N_{CW}(2)$ of the second transmission stream is 2 (=ceiling((4×182/1)/(672× (13/16))×1)).

As can be seen from Equation (8), the number of data paddings $N_{DATA\_PAD}$ is 836 (=(2×1344×(3/4)+2×672×(13/ 16))−284×8) bits. Furthermore, as can be seen from Equation (9), the number of symbol blocks $N_{BLKS}$ is 1 (=ceiling (max (2×1344/(6×480×1), 2×672/(4×480×1)))). Note that $N_{SPB}$ is set to 480, and $N_{CB}$ is set to 1.

As can be seen from Equation (10), the number of block paddings $N_{BLK\_PAD}(1)$ of the first transmission stream is 192 (=480×1×1×6−2×1344) bits. Furthermore, as can be seen from Equation (10), the number of code blocks $N_{CW}(1)$ of the second transmission stream is 448 (=448×1×1×4−2× 672) bits.

FIG. 7 illustrates an example of the sequence of processes in which the encoder 103a performs LDPC coding on the first transmission stream, the data modulator 104a performs data modulation (for example, π/2 shift 64QAM), and the symbol block generator 105a adds a GI.

Like the description of FIG. 5, in the description of FIG. 7, as an example, the number of transmission data is set to 284, the LDPC codeword size ($L_{CW}(1)$) of the first transmission stream is set to 1344, and the LDPC code rate (R(1)) is set to 3/4, and the modulation scheme is set to π/2 shift 64QAM ($N_{BPSC}(1)$ is 6). In addition, the LDPC codeword size ($L_{CW}(2)$) of the second transmission stream is set to 672, the LDPC code rate (R(2)) is set to 13/16, and the modulation scheme is set to π/2 shift 16QAM ($N_{BPSC}(1)$ is 4).

Since the LDPC codeword size ($L_{CW}(1)$) of the first transmission stream is 1344 and the LDPC code rate (R(1)) is 3/4, data included in the LDPC codeword (referred to as LDPC data) is 1008 (=1344×3/4) bits. In addition, since the group size Ng(1) is 252 bits, the sum of the sizes of the four groups (for example, #1-1, #2-1, #3-1, and #4-1) corresponds to LDPC data in one codeword.

Upon receiving, from the stream generator 102, data of bits corresponding to $L_{CW}(i_{SS}) \times R(i_{SS}) \times M(i_{SS})/Ng(i_{SS})$ groups (for example, four groups, #1-1, #2-1, #3-1, and #4-1) in the first transmission stream 2010a, the encoder 103a regards the input data as $M(i_{SS})$ LDPC data (for example, the LDPC data 2020a, $M(i_{SS})$ is 1) and performs LDPC encoding on the $M(i_{SS})$ LDPC data. Thus, the encoder 103a generates parity bits (for example, parity 2021a).

Similarly, every time the encoder 103a sequentially receives data of bits corresponding to $L_{CW}(i_{SS}) \times R(i_{SS}) \times M(i_{SS})/Ng(i_{SS})$ groups (for example, #5-1, #6-1, #7-1, and #8-1), the encoder 103a performs LDPC encoding on the $M(i_{SS})$ LDPC codewords and generates parity bits (for example, parity 2021b).

The encoder 103a does not perform the encoding process on the block padding 2003a. The encoder 103a appends the block padding 2003a not subjected to the encoding process to the encoded codeword (including the LDPC data 2020a, parity 2021a, LDPC data 2020b, and parity 2021b). Thereafter, the encoder 103a outputs the codeword to the data modulator 104a.

The data modulator 104a performs data modulation (for example, π/2 shift 64QAM) on the LDPC data 2020a, parity 2021a, LDPC data 2020b, parity 2021b, and block padding 2003a and generates a symbol block 2030a. In addition, the data modulator 104a adds a GI (not illustrated) before the symbol block 2030a and adds a GI (a GI 2031a) after the symbol block 2030a to generate a transmission signal. Thereafter, the data modulator 104a outputs the generated transmission signal to the transmission F/E circuit 110a.

Note that the stream generator 102 calculates the number of groups X common to the transmission streams by using Equation (6). However, the number of groups X may be calculated as a value $X(i_{SS})$ that varies transmission stream by transmission stream. By minimizing the number of groups $X(i_{SS})$ for each of the transmission streams, the number of codewords for each of the transmission streams can be reduced, and the number of paddings can be reduced.

The stream generator 102 may calculate the number of groups $X(i_{SS})$ for each of the transmission streams by using the following Equation (16):

[Formula 16]

$$X(i_{ss}) = \left\lceil \frac{\text{Length} \times 8 - \sum_{j_{ss}=1}^{i_{ss}-1} Ng(j_{ss}) \times X(j_{ss})}{\sum_{j_{ss}=i_{ss}}^{N_{ss}} Ng(j_{ss})} \right\rceil. \quad (16)$$

Equation (16) is a recurrence equation that sequentially calculates $X(i_{SS})$ ($i_{SS}$ is 1 to $N_{SS}$). That is, $X(1)$ of the first transmission stream is calculated and, subsequently, $X(2)$ of the second transmission stream, and so on.

$X(i_{SS})$ of the $i_{SS}$-th transmission stream is calculated as follows:

The total number of undistributed bits from the first transmission stream to the "$i_{SS}$-1"-th transmission stream is calculated (the numerator of Equation (16)).

To distribute the total number of bits to the transmission streams starting from the $i_{SS}$-th transmission stream to the $N_{SS}$-th transmission stream, the total number of undistributed bits is divided by the sum of $Ng(i_{SS})$ of the $i_{SS}$-th transmission stream to $Ng(i_{SS})$ of the $N_{SS}$-th transmission stream (the denominator of Equation (16)).

When Equation (16) is used, the stream generator 102 calculates the number of codewords $N_{CW}(i_{SS})$ by using the following Equation (17) instead of Equation (11) because the value of X varies transmission stream by transmission stream:

[Formula 17]

$$N_{CW}(i_{ss}) = \left\lceil \frac{X(i_{ss}) \times Ng(i_{ss})/M(i_{ss})}{L_{CW}(i_{ss}) \times R(i_{ss})} \right\rceil \times M(i_{ss}). \quad (17)$$

As described above, the stream generator 102 of the communication apparatus 100 calculates the group size $Ng(i_{SS})$ and the number of groups X and, thereafter, determines the number of data paddings and the number of block paddings on the basis of $Ng(i_{SS})$ and X. As a result, even when different codeword sizes and data modulation schemes are used for the transmission streams, the number of paddings can be reduced, data throughput can be increased, and the radio transmission efficiency can be increased.

FIG. 8 is a diagram illustrating an example of the configuration of the receiving unit 130 of the communication apparatus 100.

The receiving unit 130 includes a MAC unit 201, a stream combining unit 202, decoders 203a and 203b, data demodulators 204a and 204b, a MIMO signal separation unit 205, reception front end (F/E) circuits 210a and 210b, and receiving antennas 211a and 211b.

Note that like the transmitter 110, the receiving unit 130 is further applicable to the case where the number of MIMO streams is 1 or 2 or more and, thus, description of the case where the number of MIMO streams is not 2 is not given here.

The receiving antennas 211a and 211b receive a MIMO radio signal (an RF signal) from another communication apparatus (for example, the communication apparatus 100).

Each of the reception F/E circuits 210a and 210b includes digital and analog filters, an A/D conversion (analog/digital conversion) circuit, and an RF (Radio Frequency) circuit. For this reason, the reception F/E circuit may be referred to as a "filter-A/D conversion-RF circuit". As the digital filter, for example, an RRC (Root Raised Cosine) filter is used. The reception F/E circuits 210a and 210b perform power amplification, conversion to a baseband signal (down convert), A/D conversion processing, and filter processing on the RF signals received by the receiving antennas 211a and 211b.

The MIMO signal separation unit 205 performs a MIMO signal separation process on the baseband signals (the MIMO signals) output from the reception F/E circuits 210a and 210b and reproduces the modulated signals of the first and second streams. Note that the MIMO signal separation unit 205 may include a timing synchronization circuit, a frequency synchronization circuit, a channel estimation circuit, and an equalization circuit.

The data demodulators 204a and 204b convert the π/2-BSPK modulation signals included in the reproduced first and second streams into bit likelihood information.

The decoders 203a and 203b perform error correction (LDPC) decoding and error detection (CRC) from the bit likelihood information sequences of the first and second streams and generate received bits.

The stream combining unit 202 collects the received bit signals of the first and second streams into a received data sequence and outputs the received data sequence to the MAC unit 201.

Note that the communication apparatuses 100 and 100a can be used in a cellular phone, a smartphone, a tablet terminal, and a television set that transmit a moving image, a still image, text data, audio/speech data, or control data.

It should be noted that the functional blocks used in the description of the above embodiments are typically implemented as LSIs, which are integrated circuits. The functional blocks may be formed as individual chips, or some or all of the functional blocks may be integrated into a single chip. The term "LSI" is used herein, but the term "IC", "system LSI", "super LSI" or "ultra LSI" may be used as well depending on the level of integration.

In addition, the circuit integration is not limited to LSI and may be achieved by dedicated circuitry or a general-purpose processor other than an LSI. A field programmable gate array (FPGA), which is programmable after fabrication of the LSI, or a reconfigurable processor which allows reconfiguration of connections and settings of circuit cells in LSI may be used.

Moreover, should a circuit integration technology replacing LSI appear as a result of advancements in semiconductor technology or other technologies derived from the technology, the functional blocks could be integrated using such a technology. Another possibility is the application of biotechnology, for example.

INDUSTRIAL APPLICABILITY

The present disclosure is suitable for a transmission apparatus, a transmission method, a reception apparatus, and a reception method that perform communication using a multi-antenna.

REFERENCE SIGNS LIST 100, 100a communication apparatus
101, 201 MAC unit
102 stream generator
103a, 103b encoder
104a, 104b data modulator
105a, 105b symbol block generator 110a, 110b transmission F/E circuit
11a, 111 b transmitting antenna
120 transmitter
130 receiving unit
202 stream combining unit
203a, 203b decoder
204a, 204b data demodulator
205 MIMO signal separation unit
210a, 210b reception F/E circuit
211a, 211b receiving antenna

The invention claimed is:

1. A transmission apparatus comprising:
a stream generator that determines a size of padding data to be added to transmission data by using a group size of each of a plurality of transmission streams calculated on the basis of a code rate and a modulation scheme that are set for each transmission stream and the number of groups calculated from a size of the transmission data and the group size of the each transmission stream, adds padding data having the determined size to the transmission data, and distributes the transmission data and the padding data to generate the plurality of transmission streams;
an encoder that encodes each of the generated transmission streams with the code rate that is set for each transmission stream;
a modulator that modulates each of the encoded transmission streams by using the modulation scheme that is set for the transmission stream; and
a radio transmitter that converts the modulated transmission streams into radio signals and transmits the radio signals from a plurality of transmitting antennas,
wherein the stream generator calculates the number of groups by dividing the size of the transmission data by a value obtained by summing the group sizes of the transmission streams, calculates the number of codewords of each the transmission streams by dividing a value obtained by multiplying the group size by the number of groups by the size per codeword, and determines the size of first padding data included in the padding data by subtracting the size of the transmission data from the sum of the sizes of the plurality of transmission streams calculated on the basis of the size of the codeword, the number of codewords, and the code rate.

2. The transmission apparatus according to claim 1, wherein the stream generator calculates the number of symbol blocks of each of the transmission streams by dividing the number of data symbols calculated from the number of codewords by the number of data symbols per symbol block, selects, from among the calculated numbers of symbol blocks of the transmission streams, the largest number of symbol blocks, and determines the size of second padding data for each of the transmission streams by subtracting the number of data symbols calculated from the number of codewords from the number of data symbols calculated from the selected largest number of symbol blocks.

3. A transmission method comprising:
calculating a group size of each of a plurality of transmission streams on the basis of a code rate and a modulation scheme that are set for each transmission stream;
calculating the number of groups from the size of each transmission data and the group size of each of the transmission streams;
determining a size of padding data added to the transmission data by using the group size of each of the transmission stream and the number of groups;
adding the padding data having the determined size to the transmission data;
distributing the transmission data and the padding data to generate the plurality of transmission streams;
encoding each of the generated transmission streams with a code rate that is set for each transmission stream;
modulating each of the encoded transmission streams by using a modulation scheme that is set for each transmission stream; and
converting the modulated transmission streams into radio signals and transmitting the radio signals from a plurality of transmitting antennas,
wherein the calculating of the number of groups includes calculating the number of groups by dividing the size of the transmission data by a value obtained by summing the group sizes of the transmission streams, and calculating the number of codewords of each the transmission streams by dividing a value obtained by multiplying the group size by the number of groups by the size per codeword; and
determining of the size of padding data includes determining the size of first padding data included in the padding data by subtracting the size of the transmission data from the sum of the sizes of the plurality of transmission streams calculated on the basis of the size of the codeword, the number of codewords, and the code rate.

4. The transmission method according to claim 3, comprising:
calculating the number of symbol blocks of each of the transmission streams by dividing the number of data symbols calculated from the number of codewords by the number of data symbols per symbol block;
selecting, from among the calculated numbers of symbol blocks of the transmission streams, the largest number of symbol blocks; and
determining the size of second padding data for each of the transmission streams by subtracting the number of data symbols calculated from the number of codewords from the number of data symbols calculated from the selected largest number of symbol blocks.

* * * * *